US012703913B2

(12) United States Patent
Ono et al.

(10) Patent No.: US 12,703,913 B2
(45) Date of Patent: Aug. 11, 2026

(54) DEPOSITION OF NOBLE METAL ISLETS OR THIN FILMS FOR ITS USE FOR ELECTROCHEMICAL CATALYSTS WITH IMPROVED CATALYTIC ACTIVITY

(71) Applicant: L'Air Liquide, Société Anonyme pour l'Etude et l'Exploitation des Procédés Georges Claude, Paris (FR)

(72) Inventors: Takashi Ono, Yokosuka (JP); Takashi Teramoto, Yokosuka (JP); Christian Dussarrat, Tokyo (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 0 days.

(21) Appl. No.: 18/714,641

(22) PCT Filed: Nov. 30, 2022

(86) PCT No.: PCT/US2022/051428
§ 371 (c)(1),
(2) Date: May 30, 2024

(87) PCT Pub. No.: WO2023/102063
PCT Pub. Date: Jun. 8, 2023

(65) Prior Publication Data

US 2025/0027197 A1 Jan. 23, 2025

Related U.S. Application Data

(60) Provisional application No. 63/284,170, filed on Nov. 30, 2021.

(51) Int. Cl.

| | |
|---|---|
| ***C23C 16/455*** | (2006.01) |
| ***C23C 16/18*** | (2006.01) |
| ***H01M 4/88*** | (2006.01) |

(52) U.S. Cl.
CPC ........ *C23C 16/45553* (2013.01); *C23C 16/18* (2013.01); *H01M 4/8867* (2013.01)

(58) Field of Classification Search
CPC .............. C23C 16/45553; C23C 16/18; C23C 16/4417; C23C 16/441; C23C 16/45555;
(Continued)

(56) References Cited

U.S. PATENT DOCUMENTS 6,018,065 A * 1/2000 Baum .................... C23C 16/18 556/136
6,720,259 B2 4/2004 Londergan et al.
(Continued)

FOREIGN PATENT DOCUMENTS

CN 101122010 2/2008
CN 101981226 2/2011
(Continued)

OTHER PUBLICATIONS

Gordon ("Overview of ALD Precursors and Reaction Mechanisms", Gordon, 2011, https://hwpi.harvard.edu/files/gordon/files/ald_precursor_chemistry_avs_ald2011.pdf) (Year: 2011).*
(Continued)

*Primary Examiner* — Michael G Miller
(74) *Attorney, Agent, or Firm* — Allen E. White

(57) ABSTRACT

Platinum group metal containing chemical precursors suitable for vapor deposition are disclosed. Methods of using these precursors for Platinum depositions are also disclosed. The chemical precursors and methods are particularly suitable for depositing catalyst material on electrodes.

11 Claims, 2 Drawing Sheets

(58) Field of Classification Search
CPC .... H01M 4/8867; H01M 4/505; H01M 4/525; H01M 4/5825; H01M 4/921; H01M 4/92; C01B 32/15; C01B 32/20; Y02E 60/10; C07F 15/0086; C07F 17/02
See application file for complete search history.

(56) References Cited

U.S. PATENT DOCUMENTS

| | | | | |
|---|---|---|---|---|
| 6,984,591 | B1 * | 1/2006 | Buchanan | H10D 84/038 257/E21.174 |
| 7,964,441 | B2 | 6/2011 | Joe et al. | |
| 8,084,087 | B2 | 12/2011 | Bent et al. | |
| 8,092,721 | B2 | 1/2012 | Gatineau et al. | |
| 8,821,968 | B2 | 9/2014 | Jiang et al. | |
| 8,877,655 | B2 | 11/2014 | Shero et al. | |
| 9,005,816 | B2 | 4/2015 | Amine et al. | |
| 2002/0011463 | A1 | 1/2002 | Buskirk et al. | |
| 2002/0154310 | A1 * | 10/2002 | DiMeo, Jr. | G01N 33/005 356/437 |
| 2007/0105008 | A1 | 5/2007 | Gu et al. | |
| 2008/0107812 | A1 * | 5/2008 | Dussarrat | C23C 16/18 427/255.28 |
| 2010/0119406 | A1 | 5/2010 | Dussarrat et al. | |
| 2010/0221577 | A1 * | 9/2010 | Dussarrat | C23C 16/406 427/419.8 |
| 2011/0256721 | A1 * | 10/2011 | Gatineau | C23C 16/18 438/680 |
| 2011/0294672 | A1 | 12/2011 | Doppelt et al. | |
| 2013/0202794 | A1 * | 8/2013 | Dussarrat | C23C 16/45557 427/252 |
| 2015/0087851 | A1 * | 3/2015 | Harada | B01J 25/02 556/136 |
| 2018/0066357 | A1 | 3/2018 | Harada et al. | |
| 2018/0316062 | A1 | 11/2018 | Leobandung et al. | |
| 2018/0363136 | A1 | 12/2018 | Spencer, II et al. | |
| 2019/0062914 | A1 | 2/2019 | King et al. | |
| 2019/0264325 | A1 | 8/2019 | Prinz et al. | |
| 2020/0148713 | A1 | 5/2020 | Harada et al. | |

FOREIGN PATENT DOCUMENTS

| | | |
|---|---|---|
| CN | 102947482 | 2/2013 |
| JP | S61 211370 | 9/1986 |
| JP | 2002 60944 | 2/2002 |
| JP | 2003 517515 | 5/2003 |
| JP | 2003 529748 | 10/2003 |
| JP | 2010 504424 | 2/2010 |
| JP | 2012 515193 | 7/2012 |
| JP | 2013 539501 | 10/2013 |
| JP | 2016 211048 | 12/2016 |
| JP | 2019 23336 | 2/2019 |
| WO | WO 2009 087609 | 7/2009 |
| WO | WO 2010 052672 | 5/2010 |
| WO | WO 2013 183703 | 12/2013 |

OTHER PUBLICATIONS

International Search Report and Written Opinion for corresponding PCT/US2022/051428, Mar. 28, 2023.

Gozum, J.E. et al., "Tailored" organometallics as precursors for the chemical vapor deposition of high-purity palladium and platinum thin films, J. Am. Chem. Soc. 1998, 110, 2688-2689.

* cited by examiner

DEPOSITION OF NOBLE METAL ISLETS OR THIN FILMS FOR ITS USE FOR ELECTROCHEMICAL CATALYSTS WITH IMPROVED CATALYTIC ACTIVITY

CROSS REFERENCE TO RELATED APPLICATIONS

This application is a 371 of International Application No. PCT/US2022/051428, filed Nov. 30, 2021, which claims priority to U.S. Provisional Patent Application No. 63/284,170, filed Nov. 30, 2022, the entire contents of which are incorporated herein by reference.

TECHNICAL FIELD

The deposition of noble metal islets or thin films for its use for electrochemical catalysts with improved catalytic activity.

BACKGROUND OF THE INVENTION

Pt-containing films are well-known for their applications to form surface coating layers or films of catalytic materials in fuel cell applications. Examples of Pt-containing films include platinum metal, platinum oxide, platinum ruthenium alloys and compounds, platinum titanium alloys and compounds, etc.

Polymer electrolyte membrane fuel cells (PEMFC) have a strong potential as power sources for applications such as zero emission vehicles. However, currently industrialized or state-of-the-art PEMFCs suffer from different issues. One of the most technical and economical important drawbacks is the quantity of expensive platinum and/or other platinum group metals ruthenium, rhodium, palladium, osmium, and iridium (PGMs) in form of islets, clusters or nanoparticles, which are used as catalysts in a membrane electrode assembly (MEA) of a fuel cell. While the quantity of a PGM catalyst is mainly determined by the power specification per unit cell in a fuel cell stack, a significant addition of a PGM catalyst leads to some deterioration processes and then to compromise the reliability of a fuel cell during its lifetime. Typical deterioration processes are related to the loss of platinum or a PGM material or loss of catalytically active surface area such as: platinum or PGM particle dissolution and corrosion, platinum or PGM particle agglomeration, platinum or PGM particle detachment from the carbon support, and other issues. At the same time, the use of larger platinum or PGM particles requires a higher amount of platinum or PGM to be used, increasing the cost of the fuel cell.

In order to reduce the amount of Pt or PGM use, one may prefer the usage of platinum or PGM nanoparticles, or islets, or nanodots (e.g., preferably of the size of less than 20 nm, more preferably less than 10 nm, most preferably between 2 nm and 5 nm). Such platinum or PGM nanoparticles, or islets, or nanodots preferably consisting of one or few monolayers of Pt, so as to maintain a large surface-to-volume ratio, and thus enabling a large catalytic and/or electrochemical activity.

Proposed solutions to reduce the quantity of PGM include compounding the PGM with a non-noble metal, covering Pt or PGM-containing metal or alloy on a non-noble core material or the formation of a nano-structured thin film. Alloyed catalysts may provide an improved catalytic activity although the alloyed catalysts can lead to consequential detrimental deteriorations. In addition, the wet deposition techniques, typically used to prepare current and state-of-the-art catalysts, have limited scalability and limited control of the nanoparticle's morphology (size, shape) making the nanoparticles very sensitive to degradation, dissolution, corrosion, and other issues. When Pt or PGM are deposited by physical vapor deposition or sputtering, it results in non-uniform and non-conformal coatings which necessarily impact fuel cell performance.

As a result, in order to prepare cost-effective amount of materials incorporating Pt or PGM-containing nanoparticles, the industry has developed batch-type furnaces in order to treat large quantities of substrates, typically carbon-based, typically in the form of powders, via vapor deposition so that the large aggregate surface areas treated can lead to uniformly distributed particles into the substrates or supports. Significant efforts have been undertaken to increase the number and types of vaporizable precursors that can be available for such systems. However, there remain substantial challenges in delivering appreciable quantities of some of these materials in a reliable fashion.

The deposition processes can be done in reactants treating flat or quasi-flat surfaces, like single-substrate, batch, roll-to-roll or spatial ALD reactors known to the man of the art. The use of powder reactor, in combination of ALD or CVD techniques, is also increasingly considered for performing uniform coatings on batteries' electrode active materials. A vertical reaction chamber may be used so as to form a fluidized zone in which the coating reactions occur. It has been observed that the powder particles in fluidized beds tend to stick to each other forming larger particle blocks, agglomerates. In order to hinder the formation of agglomerates, a vibrating gas flow is used, a carefully selected gas flow that vibrates is hence fed into the reaction chamber. According to the principle of Helmholtz resonance, an incoming gas flow is forced over and into a cavity causing vibrations into the outgoing gas flow. The outgoing vibrating gas flow is guided into the reaction chamber in order to hinder the formation of agglomerates.

In particular for powder reactor coating, industry therefore needs Pt or PGM precursors having a high vapor pressure, high stability and cost-effective preparation. At this point of time, the Pt precursors leading to the highest vapor pressure and sufficient stability is Pt(MeCp)Me3 and closely related molecules. Pt(MeCp)Me3 has a vapor pressure of 0.053 Torr at 23° C. The synthesis of these molecules are complex, involving at least 6 steps, making the preparation of the chemistry a significant economic challenge. Other proposed precursors with higher stability are platinum bis beta-diketonates such as Pt(tmhd)2 and Pt(acac)2.

BRIEF SUMMARY OF THE INVENTION

Disclosed are novel platinum or PGM precursors for depositing platinum or PGM-containing films or islets, and methods of synthesizing the same and methods of using the same. In particular, the disclosed precursors exhibit good volatility and high thermal stability. The disclosed precursors are liquid below 100° C., preferably liquid at 50° C. or less, most preferably liquid at 20° C. or less, which is suitable for deposition techniques such as ALD and CVD applications in high specific surface surfaces such as powder, batch reactors.

The precursors are suitable for use in the deposition of a catalyst by vapor phase deposition to form islets or clusters or nanoparticles, or a thin film of a PGM covering in part or in whole a substrate, optionally after a prior surface functionalization. The vapor phase reaction may involve the use of PGM precursors in combination with H, O, N or F-containing sources. The platinum-containing or PGM-containing nanoparticles, or islets, or nanodots are preferably of the size of less than 20 nm, more preferably less than 10 nm, most preferably between 2 nm and 5 nm. Such platinum or PGM nanoparticles, or islets, or nanodots preferably consisting of one or few monolayers of Pt or PGM-containing material.

BRIEF DESCRIPTION OF THE SEVERAL VIEWS OF THE DRAWING

For a further understanding of the nature and objects for the present invention, reference should be made to the following detailed description, taken in conjunction with the accompanying drawings, in which like elements are given the same or analogous reference numbers and wherein.

NOTATION AND NOMENCLATURE

Figure 1:
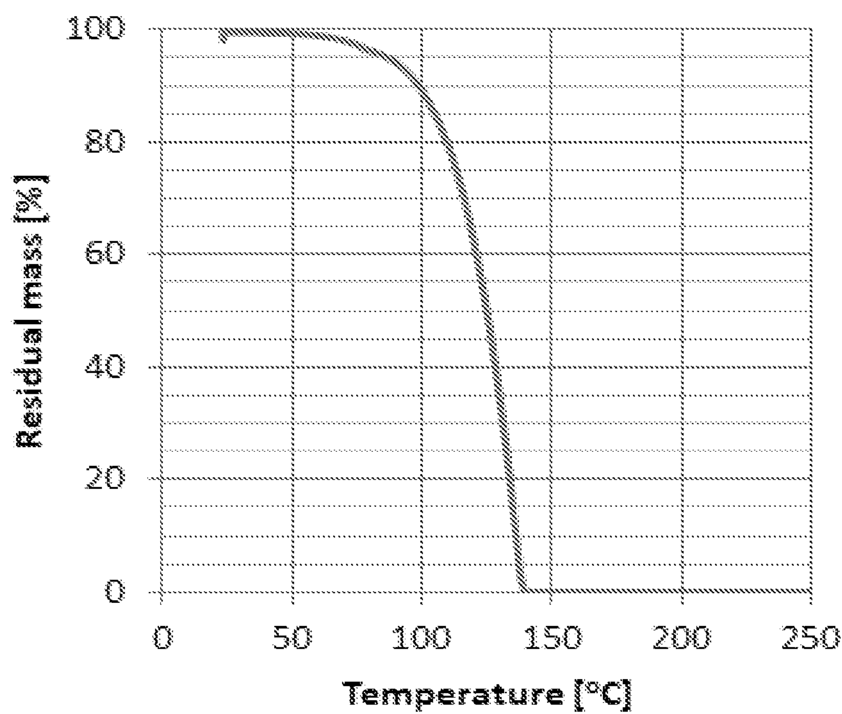
FIG. 1 shows a vacuum TGA for Pt(allyl)(iPr-amd)

The following detailed description and claims utilize a number of abbreviations, symbols, and terms, which are generally well known in the art. Certain abbreviations, symbols, and terms are used throughout the following description and claims, and include: As used herein, the indefinite article "a" or "an" means one or more.

As used herein, "about" or "around" or "approximately" in the text or in a claim means ±10% of the value stated.

As used herein, "room temperature" in the text or in a claim means from approximately 20° C. to approximately 25° C.

The term "ambient temperature" refers to an environment temperature approximately 20° C. to approximately 25° C.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., $SiO_2$, SiN, SiON, SiCOH, etc.), metal containing layers (e.g., copper, cobalt, tungsten, platinum, palladium, nickel, ruthenium, gold, etc.) or combinations thereof. Furthermore, the substrate may be planar or patterned. The substrate may be an organic patterned photoresist film. The substrate may include layers of oxides which are used as dielectric materials in MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates.

The term "wafer" or "patterned wafer" refers to a wafer having a stack of films on a substrate and at least the top-most film having topographic features that have been created in steps prior to the deposition of the indium containing film.

The term "nanodot" means a discrete deposit of e.g. Pt having a maximal cross-sectional dimension from 1 nanometer to 100 nanometers. Nano dots are most often roughly hemispherical or roughly circular, but may be any shape, including irregular shaped formations.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line. "Cathode" in lithium ion batteries refers to the positive electrode in an electrochemical cell (battery) where the reduction of cathode materials takes place by insertion of electrons and lithium ions during charge. During discharge, cathode materials are oxidized by releasing electrons and lithium ions. Lithium ions move from cathode to anode or vice versa within an electrochemical cell through electrolyte, while electrons are transferred through an external circuit. Cathode is generally composed of cathode active material (i.e. lithiated metal layered oxide) and conductive carbon black agent (acetylene black Super C65, Super P) and binder (PVDF, CMC).

"Cathode active materials" are the main elements in the composition of cathode (positive electrode) for battery cells. The cathode materials are, for example, cobalt, nickel and manganese in the crystal structure such as the layered structure, forms a multi-metal oxide material in which lithium is inserted. The examples of cathode active materials are layered lithium nickel manganese cobalt oxide (LiNixMnyCozO2), spinel lithium manganese oxide (LiMn2O4) and olivine lithium iron phosphate (LiFePO4).

Note that herein, the terms "deposition temperature" and "substrate temperature" may be used interchangeably. It is understood that a substrate temperature may correspond to, or be related to a deposition temperature, and that the deposition temperature may refer to the substrate temperature.

Note that herein, the terms "precursor" and "deposition compound" and "deposition gas" may be used interchangeably when the precursor is in a gaseous state at room temperature and ambient pressure. It is understood that a precursor may correspond to, or be related to a deposition compound or deposition gas, and that the deposition compound or deposition gas may refer to the precursor.

The standard abbreviations of the elements from the periodic table of elements are used herein. It should be understood that elements may be referred to by these abbreviation (e.g., Si refers to silicon, N refers to nitrogen, O refers to oxygen, C refers to carbon, H refers to hydrogen, F refers to fluorine, etc.).

As used herein, the term "hydrocarbon" refers to a saturated or unsaturated function group containing exclusively carbon and hydrogen atoms. As used herein, the term "alkyl group" refers to saturated functional groups containing exclusively carbon and hydrogen atoms. An alkyl group is one type of hydrocarbon. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation "Me" refers to a methyl group; the abbreviation "Et" refers to an ethyl group; the abbreviation "Pr" refers to any propyl group (i.e., n-propyl or isopropyl); the abbreviation "iPr" refers to an isopropyl group; the abbreviation "Bu" refers to any butyl group (n-butyl, iso-butyl, tert-butyl, sec-butyl); the abbreviation "tBu" refers to a tert-butyl group; the abbreviation "sBu" refers to a sec-butyl group; the abbreviation "iBu" refers to an iso-butyl group; the abbreviation "Ph" refers to a phenyl group; the abbreviation "Am" refers to any amyl group (iso-amyl, sec-amyl, tert-amyl); the abbreviation "Cy" refers to a cyclic hydrocarbon group (cyclobutyl, cyclopentyl, cyclohexyl, etc.); the abbreviation "Ar" refers to an aromatic hydrocarbon group (phenyl, xylyl, mesityl, etc.); the abbreviation "amd" refers to an amidinate structure.

Ranges may be expressed herein as from about one particular value, and/or to about another particular value. When such a range is expressed, it is to be understood that another embodiment is from the one particular value and/or to the other particular value, along with all combinations within said range. Any and all ranges recited herein are inclusive of their endpoints (i.e., x=1 to 4 or x ranges from 1 to 4 includes x=1, x=4, and x=any number in between), irrespective of whether the term "inclusively" is used.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation." As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x (NR^2R^3)^{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

"Comprising" in a claim is an open transitional term which means the subsequently identified claim elements are a nonexclusive listing (i.e., anything else may be additionally included and remain within the scope of "comprising"). "Comprising" is defined herein as necessarily encompassing the more limited transitional terms "consisting essentially of" and "consisting of"; "comprising" may therefore be replaced by "consisting essentially of" or "consisting of" and remain within the expressly defined scope of "comprising".

"Providing" in a claim is defined to mean furnishing, supplying, making available, or preparing something. The step may be performed by any actors in the absence of express language in the claim to the contrary.

Hapticity is when two or more contiguous atoms in a chemical structure form a coordinated ligand with a metal. Haptic ligands are denoted by the Greek symbole eta followed by the number of atoms participating in the coordinated ligand. η5- for example means a five atom coordinated ligand while η3- means a three atom ligand.

Some ligands can form different Hapticities. Cyclopentadienyl ligands for example can be η1-, η5- or η3- and are often separated as a special subcategory of metal ligands.

DETAILED DESCRIPTION OF THE INVENTION

Precursors

The disclosed precursors are liquid below 100° C., preferably liquid at 50° C. or less, most preferably liquid at 20° C. or less, which is suitable for deposition techniques such as ALD and CVD applications in high specific surface surfaces such as powder, batch reactors.

Precursors disclosed herein are defined by the following chemical genus definitions:

M(L1)(L2)x where:

- M represent Pt or other PGM element and
- L1 can be a η5- ligand excluding cyclopentadienyl such as a pentadienyl, a cyclohexadienyl, a cycloheptadienyl, pyrrolyl, a heterocyclic ligand.
- L2 can be an H, an alkyl group, an allyl group, NO, a halide, an alkoxide, an amide, an alkoxycarbyl, an aminocarbyl, a beta-diketonate, a beta-diketoiminate, a ketoiminate, a formamidinate, an amidinate, a guanidinate, a carbon chain, a carbyl
- x represents the number of L2 ligands
- Each L2 can be identical or different
- Each L2 can independently be an ionic or neutral ligand M(L3)(L4)x where:

- M represent Pt or other PGM element and
- L3 can be a η5- ligand such as a cyclopentadienyl ligand.
- L4 can be an H, a C2-C6 alkyl group, NO, a halide, an alkoxide, an amide, an alkoxycarbyl, an aminocarbyl, a beta-diketonate, a beta-diketoimide, a formamidinate, an amidinate, a guanidinate,
- x represents the number of L4 ligands
- Each L4 can be identical or different
- Each L4 can independently be an ionic or a neutral ligand M(L5)(L6)x where:

- M represent Pt or other PGM element and
- L5 can be a η3- ligand such as an allyl ligand.
- L6 can be an H, a C2-C6 alkyl group, NO, a halide, an alkoxide, an amide, an alkoxycarbyl, an aminocarbyl, pentadienyl, a cyclohexadienyl, a cycloheptadienyl, pyrrolyl, a heterocyclic ligand, a beta-diketonate, a beta-diketoimide, a formamidinate, an amidinate, a guanidinate, x represents the number of L6 ligands Each L6 can be identical or different Each L6 can independently be an ionic or neutral ligand For one preferred subgenus of M(L5)(L6)x, L5 is an allyl ligand and L6 is an amidinate ligand:

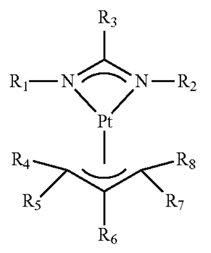

wherein each of R1, R2, R3, R4, R5, R6, R7, and R8 are independently selected from H; a C1-C6 linear, branched, or cyclic alkyl group; a C1-C6 linear, branched, or cyclic alkylsilyl group (mono, bis, or tris alkyl); a C1-C6 linear, branched, or cyclic alkylamino group; or a C1-C6 linear, branched, or cyclic fluoroalkyl group.

The disclosed PGM precursors exhibit good volatility and thermal stability. Moreover, the disclosed PGM precursors may be liquid or low melting point solids. The low melting point of the disclosed phosphorus-containing platinum or PGM precursors may be <100° C., preferably less than 50° C., more preferably approximately 20° C. The disclosed PGM precursors are convenient to use for ALD and CVD applications.

The disclosed PGM precursors may have chelating functionalities in order to decrease their melting point and increase their volatility. More specifically, nitrogen or oxygen chelating functionalities for instance were introduced as neutral donors for electronic and steric properties of the PGM precursors. The coordination sphere of the disclosed PGM precursors is thus more saturated and less prompt to oligomerization. Hence, when ALD or CVD processes are targeted, the vapors of the disclosed PGM precursors may be delivered into a deposition reactor more effectively, thereby reducing the deposition time and leading to the deposited films or islets having high uniformity and conformality.

The disclosed PGM precursors may be synthesized by unknown or known synthetic methods. The disclosed PGM precursors may be used in a chemical deposition method, such as ALD or CVD, individually or in mixtures, different platinum precursors, and metal precursor(s) in solution or not in solution to form Pt-containing films or islets such as Pt metal, platinum ruthenium alloys, platinum titanium alloys, platinum ruthenium compounds, platinum titanium compounds, etc.

Preferably, the disclosed PGM precursors have suitable properties for vapor deposition methods, such as vapor pressure ranging from approximately 0.1 Torr at 23° C. to approximately 1,000 Torr at 23° C., a melting point below 20° C. (preferably being in liquid form at room temperature) and more preferably below −20° C. to prevent freeze/thaw issues, and exhibiting 0% by volume or v/v to 1% v/v decomposition per week at the temperature required to obtain a usable vapor pressure (1-100 Torr).

While the disclosed PGM precursors are ideally liquids and vaporized in bubblers or direct liquid injection systems, the use of solid precursors for ALD/CVD precursor vaporization is also possible using sublimators such as ones disclosed in PCT Publication WO2009/087609 to Xu et al.

Alternatively, solid precursors may be mixed or dissolved in a solvent to reach a usable melting point and viscosity for usage by Direct Liquid Injection systems. While the disclosed PGM precursors are ideally liquids, solid precursors for liquid phase deposition techniques such as spray coating, slit coating and spin on deposition, may be mixed or dissolved in a solvent to reach a usable melting point and viscosity for flowing the precursor solutions into the reactor.

To ensure process reliability, the disclosed PGM precursors may be purified by continuous or fractional batch distillation or sublimation prior to use to a purity ranging from approximately 93% by weight or w/w to approximately 100% w/w, preferably ranging from approximately 99% w/w to approximately 99.999% w/w, more preferably, ranging from approximately 99% w/w to approximately 100% w/w. One of ordinary skill in the art will recognize that the purity may be determined by 1H NMR or gas or liquid chromatography with mass spectrometry. The Pt-containing film or islet forming compositions may contain any of the following impurities: oxygen, hydroxide, fluorine, nitrogen, hydrogen, phosphorus, halogenated metal compounds. Preferably, the total quantity of these impurities is below 0.1% w/w. The purified composition may be produced by recrystallization, sublimation, distillation, and/or passing the gas or liquid through a suitable adsorbent, such as 4A molecular sieves.

The disclosed Pt-containing film or islet forming compositions preferably contain less than 5% v/v, preferably less than 1% v/v, more preferably less than 0.1% v/v, and even more preferably less than 0.01% v/v of any of its analogs or other reaction products. This embodiment may provide better process repeatability. This embodiment may be produced by distillation or other purification techniques known in the art.

The concentration of trace metals and metalloids in the purified PGM film or islet forming composition may each range independently from approximately 0 ppbw to approximately 100 ppbw, and more preferably from approximately 0 ppbw to approximately 10 ppbw. These metal or metalloid impurities include, but are not limited to, Aluminum(Al), Arsenic(As), Barium(Ba), Beryllium(Be), Bismuth(Bi), Cadmium(Cd), Calcium(Ca), Chromium(Cr), Cobalt(Co), Copper(Cu), Gallium(Ga), Germanium (Ge), Hafnium(Hf), Zirconium(Zr), Indium(In), Iron(Fe), Lead(Pb), Magnesium (Mg), Manganese(Mn), Tungsten(W), Nickel(Ni), Potassium(K), Sodium(Na), Strontium(Sr), Thorium(Th), Tin(Sn), Titanium(Ti), Uranium(U), Vanadium(V) and Zinc(Zn). The concentration of X (where X=Cl, Br) in the purified PGM film or islet forming composition may range between approximately 0 ppmw and approximately 100 ppmw and more preferably between approximately 0 ppmw to approximately 10 ppmw.

Deposition Processes

Also disclosed are methods of using the disclosed PGM film or islet forming compositions for vapor depositions such as ALD or CVD techniques. The disclosed methods provide for the use of the PGM film or islet forming compositions for deposition of PGM-containing films or islets. The disclosed methods may be useful in the manufacture of electrochemical catalysts materials in fuel cell industry.

The disclosed methods for forming a PGM-containing layer on a substrate include: placing a substrate in a reactor, delivering into the reactor a vapor of the disclosed PGM-containing film or islet forming composition, and contacting the vapor with the substrate (and typically directing the vapor to the substrate) to form a PGM-containing layer, islet or nanodot on the surface of the substrate.

The methods may include forming a bimetal-containing layer on a substrate using the vapor deposition process and, more specifically, for deposition of PtRu, PtTi layers. The disclosed methods may be useful in the manufacture of fuel cells.

The disclosed PGM-containing film or islet forming compositions may be used to deposit PGM-containing films, nanodots or islets using any deposition methods known to those of skill in the art. Examples of suitable deposition methods include chemical vapor deposition (CVD) or atomic layer deposition (ALD) with or without plasma treatment, or a liquid-based deposition. Exemplary CVD methods include thermal CVD, pulsed CVD (PCVD), low pressure CVD (LPCVD), sub-atmospheric CVD (SACVD) or atmospheric pressure CVD (APCVD), hot-wire CVD or hot filament CVD (also known as cat-CVD, in which a hot wire serves as an energy source for the deposition process), hot wall CVD, cold wall CVD, aerosol assisted CVD, direct liquid injection CVD, combustion CVD, hybrid physical-CVD, metalorganic CVD, rapid thermal CVD, photo-initiated CVD, laser CVD, radicals incorporated CVD, plasma enhanced CVD (PECVD) including but not limited to flowable PECVD, and combinations thereof. Exemplary ALD methods include thermal ALD, plasma enhanced ALD (PEALD), spatial isolation ALD, temporal ALD, selective or not ALD, hot-wire ALD (HWALD), radicals incorporated ALD, and combinations thereof. Super critical fluid deposition may also be used. The deposition method is preferably ALD, PE-ALD, or spatial ALD in order to provide suitable step coverage and film thickness control. Liquid-based deposition are exemplified by spin-on deposition (SOD), spray deposition, dip-coating, slit-coating.

The vapor of the PGM-containing film or islet forming composition is generated and then introduced into a reaction chamber containing a substrate. The temperature and the pressure in the reaction chamber and the temperature of the substrate are held at conditions suitable for vapor deposition of at least part of the PGM-containing precursor onto the substrate. In other words, after introduction of the vaporized composition into the reaction chamber, conditions within the reaction chamber are adjusted such that at least part of the precursor is deposited onto the substrate to form the PGM-containing layer, islet or nanodot. One of ordinary skill in the art will recognize that "at least part of the precursor is deposited" means that some or all of the precursor reacts with or adheres to the substrate.

The reaction chamber or reactor may be any enclosure or chamber of a device in which deposition methods take place, such as, without limitation, a parallel-plate type reactor, a cold-wall type reactor, a hot-wall type reactor, a single-wafer reactor, a multi-wafer reactor, or other such types of deposition systems. All of these exemplary reaction chambers are capable of serving as an ALD or CVD reaction chamber. The reaction chamber may be maintained at a pressure ranging from about 0.5 mTorr to about 20 Torr for all ALD and subatmospheric CVD. Subatmospheric CVD and atmospheric CVD pressures may range up to 760 Torr (atmosphere). In addition, the temperature within the reaction chamber may range from a temperature below room temperature, such as about 0° C., to about 600° C. Preferably, the temperature within the reaction chamber may range from about 15° C. to about 400° C. More preferably, the temperature within the reaction chamber may range from about 20° C. to about 300° C. One of ordinary skill in the art will recognize that the temperature may be optimized through mere experimentation to achieve the desired result.

The temperature of the reactor may be controlled by either controlling the temperature of the substrate holder or controlling the temperature of the reactor wall. Devices used to cool or heat the substrate are known in the art. The reactor wall is heated to a sufficient temperature to obtain the desired film or islet at a sufficient growth rate and with desired physical state and composition. A non-limiting exemplary temperature range to which the reactor wall may be heated includes from approximately 20° C. to approximately 600° C. When a plasma deposition process is utilized, the deposition temperature may range from approximately 20° C. to approximately 550° C. Alternatively, when a thermal process is performed, the deposition temperature may range from approximately 50° C. to approximately 600° C.

Alternatively, the substrate may be heated to a sufficient temperature to obtain the desired PGM-containing film, islet or nanodot at a sufficient growth rate and with desired physical state and composition. A non-limiting exemplary temperature range to which the substrate may be heated includes from room temperature to approximately 600° C. Preferably, the temperature of the substrate remains less than or equal to 500° C.

The reactor contains one or more substrates onto which the films, nanodots or islets will be deposited. A substrate is generally defined as the material on which a process is conducted. The substrates may be any suitable substrate used in semiconductor or lithium battery industry. Examples of suitable substrates include wafers or supports, such as silicon, silica, glass substrates. The support may have one or more layers of differing materials deposited on it from a previous manufacturing step. For example, the supports may include silicon layers (crystalline, amorphous, porous, etc.), silicon oxide layers, silicon nitride layers, silicon oxy nitride layers, carbon doped silicon oxide (SiCOH) layers, or combinations thereof. The disclosed PGM precursors used in the fuel cell industry may be deposited on powders made of graphite, doped graphite, especially Si-doped graphite, silicon and silicon alloys, or graphite made of metallic oxides. The underlying materials may include such as a graphene, nanotubes, glassy carbons, a graphitic or amorphous carbon, etc. The substrates may be planar, spherical, rounded or patterned, or may not have regular structures (see above). For example, the layer may be an underlying materials made of hydrogenated carbon, for example $CH_x$, wherein x is greater than zero. The preferred underlying materials are a graphitic or amorphous carbon, a graphene, nanotubes, or glassy carbons.

The disclosed processes may deposit the PGM-containing layer directly on the support or directly on one or more than one of the layers on top of the support. The substrate may be patterned or may include complex tridimensional structures. For example, a conformal PGM-containing film, such as Pt metal, may be deposited using any ALD/CVD technique on a substrate having an aspect ratio ranging from approximately 20:1 to approximately 1000:1. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. In many instances though, the preferred substrate utilized may be selected from hydrogenated carbons, silicon-based carbons, or Si type substrates.

The disclosed PGM-containing film forming compositions may be supplied either in neat form or in a blend with a suitable solvent, such as toluene, ethyl benzene, xylene, mesitylene, decane, dodecane, octane, hexane, pentane, tertiary amines, acetone, tetrahydrofuran, ethanol, ethylmethylketone, 1,4-dioxane, or others. The disclosed compositions may be present in varying concentrations in the solvent. For example, the resulting concentration may range from approximately 0.05M to approximately 2 M.

The neat or blended PGM-containing film forming compositions are delivered into a reactor in vapor form by conventional means, such as tubing and/or flow meters. The composition in vapor form may be produced by vaporizing the neat or blended composition through a conventional vaporization step such as direct vaporization, distillation, by bubbling, or by using a sublimator such as the one disclosed in PCT Publication WO2009/087609 to Xu et al. The neat or blended composition may be fed in liquid state to a vaporizer where it is vaporized before it is introduced into the reactor. Alternatively, the neat or blended composition may be vaporized by passing a carrier gas into a container containing the composition or by bubbling of the carrier gas into the composition. The carrier gas may include, but is not limited to, Ar, He, or $N_2$, and mixtures thereof. Bubbling with a carrier gas may also remove any dissolved oxygen present in the neat or blended composition. The carrier gas and composition are then introduced into the reactor as a vapor.

If necessary, the container may be heated to a temperature that permits the PGM-containing film forming composition to be in its liquid phase and to have a sufficient vapor pressure. The container may be maintained at temperatures in the range of, for example, 0-150° C. Those skilled in the art recognize that the temperature of the container may be adjusted in a known manner to control the amount of PGM-containing film forming composition vaporized.

In addition to the disclosed PGM precursors, a reactant or a co-reactant may also be introduced into the reactor. The co-reactant may be an oxygen-containing gas for Pt-containing film deposition. The oxygen-containing gas includes, but is not limited to, oxidizers such as, $O_3$, $O_2$, $H_2O$, trimethyphosphate, an alkylphosphate, an alkylphosphinimine, $RuO_4$, NO, $N_2O$, $H_2O_2$, O radicals, or combinations thereof, preferably $O_3$ or $O_2$. Typically, $O_3/O_2$ mixtures are used for high temperature (e.g., approximately 500° C. or higher) oxide deposition. In addition, the co-reactant may also be $F_2$, $NF_3$, $N_2F_4$, FNO, ClF, $ClF_3$ or another interhalogen.

The disclosed vapor deposition processes (e.g., ALD, CVD) typically include a step to remove excess co-reactant from the deposition surface by providing a purge step, either by purging a reactor with an inert gas, or passing the substrate in a sector under high vacuum and/or a carrier gas curtain. The co-reactants listed above may be treated by plasma, in order to decompose the co-reactant into its radical form. $N_2$ may also be utilized as a reducing agent when treated with plasma. For instance, the plasma may be generated with a power ranging from about 50 W to about 500 W, preferably from about 100 W to about 200 W. The plasma may be generated or present within the reactor itself. Alternatively, the plasma may generally be at a location removed from the reactor, for instance, in a remotely located plasma system. One of skill in the art will recognize methods and apparatus suitable for such plasma treatment.

The disclosed PGM-containing film, nanodot or islet forming composition and one or more co-reactants may be introduced into the reaction chamber simultaneously (e.g., CVD), sequentially (e.g., ALD), or in other combinations. For example, the PGM-containing film or islet forming composition may be introduced in one pulse and two additional reactants may be introduced together in a separate pulse (e.g., modified ALD). Alternatively, the reaction chamber may already contain the co-reactant prior to introduction of the disclosed PGM-containing film or islet forming composition. The co-reactant may be passed through a plasma system localized or remotely from the reaction chamber, and decomposed to radicals. Alternatively, the PGM-containing film, nanodot or islet forming composition may be introduced to the reaction chamber continuously while other reactants are introduced by pulse (e.g., pulsed-CVD). In each example, a pulse may be followed by a purge or evacuation step to remove excess amounts of the component introduced. In each example, the pulse may last for a time period ranging from about 0.01 s to about 10 s, alternatively from about 0.3 s to about 3 s, alternatively from about 0.5 s to about 2 s. In another alternative, the PGM-containing film, nanodot, or islet forming composition and one or more co-reactants may be simultaneously sprayed from a shower head under which a susceptor holding several substrates is spun (e.g., spatial ALD).

In one non-limiting exemplary ALD type process, the vapor phase of a PGM-containing film, nanodot, or islet forming composition is introduced into the reaction chamber, where at least part of the PGM-containing precursor reacts with a suitable substrate, such as C, Si, $SiO_2$, $Al_2O_3$, etc., to form an adsorbed PGM-containing layer, nanodot, or islet. Excess composition may then be removed from the reaction chamber by purging and/or evacuating the reaction chamber. $H_2$ or $NH_3$ is introduced into the reaction chamber where it reacts with the adsorbed PGM-containing layer in a self-limiting manner. Any excess $H_2$ or $NH_3$ is removed from the reaction chamber by purging and/or evacuating the reaction chamber. This two-step process may provide the desired film thickness or may be repeated until a film having the necessary thickness has been obtained.

Alternatively, if the desired PGM-containing film, nanodot, or islet contains a second element (e.g., PtM, where M is P, Ru, Ti, Ga, Ge, As, B, Ta, Hf, Nb, Mg, Al, Sr, Y, Ba, Ca, As, Sb, Bi, Sn, Pb, Co, lanthanides, or combinations thereof), the two-step process above may be followed by introduction of a vapor of a second precursor into the reaction chamber. The second precursor will be selected based on the nature of the PGM-M film or islet being deposited. After introduction into the reaction chamber, the second precursor is contacted with the substrate. Any excess second precursor is removed from the reaction chamber by purging and/or evacuating the reaction chamber. Once again, $H_2$ or $NH_3$ may be introduced into the reaction chamber to react with the second precursor. Excess $H_2$ or $NH_3$ is removed from the reaction chamber by purging and/or evacuating the reaction chamber. If a desired film or islet thickness has been achieved, the process may be terminated. However, if a thicker film or islet is desired, the entire four-step process may be repeated. By alternating the provision of the PGM precursor, second precursor, and $H_2$ or $NH_3$, a film of desired composition and thickness may be deposited.

The disclosed PGM-containing film, nanodot, or islet forming compositions may contain any of the following impurities: undesired co-generic species; solvents; chlorinated metal compounds; or other reaction products. In one alternative, the total quantity of these impurities is below 0.1% w/w.

Solvents, such as hexane, pentane, dimethyl ether, or anisole, may be used in the precursor's synthesis. The concentration of the solvent in the disclosed Si-containing precursors may range from approximately 0% w/w to approximately 5% w/w, preferably from approximately 0% w/w to approximately 0.1% w/w. Separation of the solvents from the precursor may be difficult if both have similar boiling points. Cooling the mixture may produce solid precursor in liquid solvent, which may be separated by filtration. Vacuum distillation may also be used, provided the precursor product is not heated above approximately its decomposition point.

In one alternative, the disclosed PGM-containing film, nanodot, or islet forming compositions contain less than 5% v/v, preferably less than 1% v/v, more preferably less than 0.1% v/v, and even more preferably less than 0.01% v/v of any of its undesired co generic species, reactants, or other reaction products. This alternative may provide better process repeatability. This alternative may be produced by distillation of the disclosed PGM precursors.

In another alternative, the disclosed PGM-containing film, nanodot, or islet forming compositions may contain between 5% v/v and 50% v/v of one or more of congeneric PGM-containing precursors, reactants, or other reaction products, particularly when the mixture provides improved process parameters or isolation of the target compound is too difficult or expensive. For example, a mixture of two PGM-containing precursors may produce a stable, liquid mixture suitable for vapor deposition.

Also disclosed are methods or processes for forming PGM-containing layers, islets, or nanodots on a substrate using an ALD or CVD process in a reaction chamber. The disclosed PGM precursors may be used to deposit Pt-containing films or islets using ALD or CVD methods known to those of skill in the art.

The disclosed vapor deposition processes using the disclosed PGM-containing precursors may be performed for substrates having a temperature range from approximately 20° C. to approximately 750° C., more preferably from 50° C. to approximately 300° C.

The substrate exposure time in the disclosed vapor deposition processes (e.g., ALD, CVD) using the disclosed precursors may range from 1 millisecond to 5 minutes, preferably from 1 second to 60 seconds. The co-reactant exposure time in the disclosed ALD processes using the disclosed precursors may range from 1 millisecond to 1 minute, preferably from 100 milliseconds to 30 seconds.

The pressure in the reaction chamber is held at conditions suitable for the PGM-containing precursor to react with the surface. For instance, the pressure in the chamber may be held between approximately 0.1 mTorr and approximately 1000 Torr, preferably between approximately 0.1 Torr and approximately 400 Torr, more preferably between approximately 1 Torr and approximately 100 Torr, even more preferably between approximately 1 Torr and approximately 10 Torr.

The temperature of the reactor chamber may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from approximately 20° C. to approximately 1000° C., preferably from approximately 50° C. to approximately 400° C. Alternatively a non-limiting exemplary temperature to which the reactor wall may be heated includes approximately 50° C. or higher. When a thermal process is performed, the deposition temperature may range from approximately 20° C. to approximately 800° C., preferably from approximately 50° C. to approximately 350° C., more preferably from approximately 100° C. to approximately 300° C.

The disclosed PGM precursors and the co-reactants may be introduced into the reactor either sequentially (ALD) or simultaneously (CVD). The reactor may be purged with an inert gas between the introduction of the precursor and the introduction of the co-reactant. Alternatively, the substrate may be moved from one area for precursor exposure to another area for co-reactant exposure (Spatial ALD).

Depending on the particular process parameters, deposition may take place for a varying length of time. Generally, deposition may be allowed to continue as long as desired or necessary to produce a film with the necessary thickness. Typical film thicknesses may vary from an atomic monolayer to several hundreds of microns, depending on the specific deposition process, preferably between 0.5 and 100 nm, more preferably between 1 and 50 nm. The deposition process may also be performed as many times as necessary to obtain the desired film.

In one non-limiting exemplary ALD type process, the vapor phase of the disclosed PGM-containing precursor is introduced into the reactor, where the PGM-containing precursor physi- or chemisorbs on the substrate. Excess composition may then be removed from the reactor by purging and/or evacuating the reactor. A desired gas (for example, $O_2$) is introduced into the reactor where it reacts with the physi- or chemisorped precursor in a self-limiting manner. Any excess reducing gas is removed from the reactor by purging and/or evacuating the reactor. If the desired film is a PGM-containing film, this two-step process may provide the desired film thickness or may be repeated until a film having the necessary thickness has been obtained. The Pt-containing films, nanodots or islets formed by the disclosed PGM-containing precursors through vapor deposition process include Pt, PtOx, PtxRuy, PtxRuyOz, PtxTiyOz, etc.

SELECTED EMBODIMENTS AND WORKING EXAMPLES

M(L1)(L2)x includes as examples:

- Pt(dmpd)Me3, Pt(chd)Me3, Pt(Me2-chd)Me3, Pt(Me2-chd)EtMe2, Pt(pyr)Me3, Pd(dmpd)Me3, Pd(chd)Me3, Pd(Me2-chd)Me3, Pd(Me2-chd)EtMe2, Pd(pyr)Me3;
- Pt(dmpd)(NO), Pt(chd)(NO), Pt(Me2-chd)(NO), Pt(pyr)(NO), Pd(dmpd)(NO), Pd(chd)(NO), Pd(Me2-chd)(NO), Pd(pyr)(NO);
- Pt(dmpd)(iPr-amd), Pt(chd)(iPr-amd), Pt(Me2-chd)(iPr-amd), Pt(pyr)(iPr-amd), Pd(dmpd)(iPr-amd), Pd(chd)(iPr-amd), Pd(Me2-chd)(iPr-amd), Pd(pyr)(iPr-amd);
- Pt(dmpd)(tmhd), Pt(chd)(tmhd), Pt(Me2-chd)(tmhd), Pt(pyr)(tmhd), Pd(dmpd)(tmhd), Pd(chd)(tmhd), Pd(Me2-chd)(tmhd), Pd(pyr)(tmhd);
- Pt(dmpd)(hfac), Pt(chd)(hfac), Pt(Me2-chd)(hfac), Pt(pyr)(hfac), Pd(dmpd)(hfac), Pd(chd)(hfac), Pd(Me2-chd)(hfac), and Pd(pyr)(hfac). "dmpd"=2,4-dimethylpentadienyl

Example 1: Synthesis of Pt(2,4-dimethylpentadienyl)$Me_3$

In a Schlenk flask charged with $[PtMe_3I]_4$ (2.9 g, 2 mmol) in THF (20 mL), was added K(dmpd) (1.0 g, 8 mmol) dissolved in THF (10 mL). The reaction mixture was stirred for 30 mins at room temperature. Evaporation of volatiles gave oily sticky solid. After extraction with hexane (30 mL) to remove insoluble salt, the volatiles were removed under reduced pressure to obtain the brownish oily solid. This was purified by sublimation to give pale yellow solid.

$^1$H NMR (400 MHz, $C_6D_6$): 5.22 (s, 1H, CH on dmpd), 2.65 (br s, 2H, CHH on dmpd), 2.21 (t, 2H, $J_{Pt-H}$=15.7 Hz, CHH on dmpd), 1.8 (br, 3H, Pt-$CH_3$), 1.73 (t, 6H, $J_{Pt-H}$=4.5 Hz, $CH_3$ on dmpd), 0.71 (br t, 6H, Pt-$CH_3$).

Prophetic Example of the Use of Pt(Dmpd)$Me_3$ (Deposition Conditions)

Using Pt(dmpd)$Me_3$ thus synthesized in combination of $H_2O$ and/or $O_3$ as the reaction gas, platinum nanodots can be formed on the substrate by an ALD method under the following conditions.

A cylinder filled with Pt(dmpd)$Me_3$ is heated to 90° C., bubbled with 100 sccm of $N_2$ gas (pulse A) and introduced into the reaction chamber, and $H_2$ is supplied with 50 sccm of $N_2$ gas (The step of introducing into the reaction chamber by pulse B is performed alternately with a 4 second purge step using 200 sccm of $N_2$ as the purge gas.) 12 cycles are performed on a carbon powder having a substrate temperature of 150° C. in an ALD chamber at a pressure of about 20 torr. As a result, platinum nanodots are obtained at 150° C.

M(L3)(L4)x includes as examples:

Pt(EtCp)(allyl), Pt(EtCp)(1-Me-allyl), Pt(EtCp(2-Me-allyl), Pd(EtCp)(allyl), Pd(EtCp)(1-Me-allyl), Pd(EtCp (2-Me-allyl), Pt(EtCp)(NO), Pd(EtCp)(NO), Pt(EtCp) (iPr-amd), Pd(EtCp)(iPr-amd), Pt(EtCp)(tmhd), Pd(EtCp)(thmd), Pt(EtCp)(hfac), and Pd(EtCp)(hfac).

Prophetic Example of the Synthesis of Pt(EtCp)(Allyl)

In a Schlenk flask charged with $[Pt(allyl)Cl]_4$ in THF, is added K(EtCp) dissolved in THF. The reaction mixture is stirred for 30 mins at room temperature. Evaporation of volatiles gives an oily solid. After extraction with hexane to remove insoluble salt, the volatiles are removed under reduced pressure to obtain the oil. This is purified by vacuum distillation to give pale yellow liquid.

$^1$H NMR (400 MHz, $C_6D_6$): 5.75-5.60 (m, 4H, Cp-H), 4.05-3.80 (m, 1H, CH on allyl), 3.53 (td, 2H, $J_{Pt-H}$=29.7 Hz, CHH on allyl), 2.35 (q, 2H, $J_{H-H}$=7.5 Hz, $CH_2CH_3$), 2.04 (td, 2H, $J_{Pt-H}$=54.2 Hz, CHH on allyl), 1.10 (t, 3H, $J_{H-H}$=7.5 Hz, $CH_2CH_3$)

Prophetic Example of the Use of Pt(EtCp)(Allyl)

(Deposition Conditions)

Using Pt(EtCp)(allyl) thus synthesized in combination of $H_2O$ and/or $O_3$ as the reaction gas, platinum nanodots can be formed on the substrate by the ALD method under the following conditions.

A cylinder filled with Pt(EtCp)(allyl) is heated to 90° C., bubbled with 100 sccm of $N_2$ gas (pulse A) and introduced into the reaction chamber, and $H_2$ is supplied with 50 sccm of $N_2$ gas (The step of introducing into the reaction chamber by pulse B is performed alternately with a 4 second purge step using 200 sccm of $N_2$ as the purge gas.) 12 cycles are performed on a carbon powder having a substrate temperature of 150° C. in an ALD chamber at a pressure of about 20 torr. As a result, platinum nanodots are obtained at 150° C.

M(L5)(L6)x includes as examples:

Pt(allyl)(iPr-amd), Pt(allyl)(iPr$_2$,Et-amd), Pt(allyl)(iPr$_2$, nBu-amd), Pt(NO)(allyl), Pt(allyl)(hfac), Pt(allyl) (tmhd), Pd(allyl)(iPr-amd), Pd(allyl)(NO), Pd(allyl)(hfac), and Pd(allyl)(tmhd).

Prophetic Example of the Use of Pt(Allyl)(Hfac)

(Deposition Conditions)

Using Pt(allyl)(hfac) in combination of H2O and/or O3 as the reaction gas, platinum nanodotscan be formed on the substrate by the ALD method under the following conditions.

A cylinder filled with Pt(allyl)(hfac) is heated to 90° C., bubbled with 100 sccm of N2 gas (pulse A) and introduced into the reaction chamber, and H2 is supplied with 50 sccm of N2 gas (The step of introducing into the reaction chamber by pulse B) was performed alternately with a 4 second purge step using 200 sccm of N2 as the purge gas. 12 cycles were performed on a carbon powder having a substrate temperature of 150° C. in an ALD chamber at a pressure of about 20 torr. As a result, platinum nanodots were obtained at 150° C.

Synthesis of Pt(Allyl)(iPr-Amd)

In a Schlenk flask charged with N,N'-diisopropylcarbodiimide (0.51 g, 4.0 mmol) and 10 mL of THF, was added MeLi (1.0 M, 4.0 mL, 4.0 mmol) at room temperature and the resulting mixture was stirred for 3 hours to obtain Li(iPr-amd) solution. In a separate Schlenk flask charged with $[Pt(allyl)Cl]_4$ (1.1 g, 1.0 mmol) in 10 mL of THF, was added Li(iPr-amd) solution at room temperature and the resulting mixture was stirred for 30 minutes to obtain cloudy yellow solution. All the volatiles were removed under reduced pressure to give pale yellow solid that was extracted with 10 mL of pentane. All the volatiles from the yellow-brown pentane solution were removed under reduced pressure at room temperature to give a crude solid. White solid was collected in a Schlenk flask cooled to −196° C. by heating the flask containing crude solid up to 80° C. under dynamic vacuum (~10 Pa). The yield was 1.2 g (3.1 mmol, 77%). mp: 70-80° C. (by DTA)

$^1$H NMR ($C_6D_6$, 400 MHz): 3.8-3.6 (m, 3H, CHH'CHCHH' and $CH_2CHCH_2$), 3.5-3.2 (sept, 2H, $^3J$=6.2 Hz, $J_{Pt-H}$=83.6 Hz, $CHMe_2$), 2.0-1.7 (d, 2H, 3J=9.4 Hz, $J_{Pt-H}$=77.6 Hz, CHH'CHCHH'), 1.40 (s, 3H, Me on amd), 1.10 (d, 6H, J=6.2 Hz, $CHMe_2$), 0.98 (d, 6H, J=6.2 Hz, $CHMe_2$)

TG measurement was carried out under the following measurement conditions: sample weight: 27.81 mg, atmosphere: N2 at 1 atm, and rate of temperature increase: 10.0° C./min. Temperature that 50% of the compound mass had evaporated was 195° C. Vacuum TG measurement was carried out under delivery conditions, under the following measurement conditions: sample weight: 25.32 mg, atmosphere: N2 at 20 mbar, and rate of temperature increase: 10.0° C./min. TG measurement was carried out under delivery conditions into the reactor (about 20 mbar). Temperature that 50% of the compound mass had evaporated was 126° C. Results are charted in FIG. 1.

Prophetic Example of the Use of Pt(Allyl)(iPr-Amd)

(Deposition Conditions)

Using Pt(allyl)(iPr-amd) in combination of $H_2$, $O_2$ and/or $O_3$ as the reaction gas, platinum nanodots can be formed on the substrate by the ALD method under the following conditions. Vapors of Pt(allyl)(iPr-amd), flown at a rate of 2 sccm for 60 s, would be introduced into the a fluidized powder reactor, alternatively with $H_2$ (30 sccm) and $N_2$ gas for 40 s (pulse B). These precursor pulses are separated with a 60 second purge step using 30 sccm of $N_2$ as the purge gas. 12 cycles were performed on a carbon powder having a substrate temperature of 50 to 200° C. in an ALD chamber at a pressure of about 20 torr. As a result, platinum nanodots are expected to be obtained at temperatures ranging from 50 to 300° C.

Synthesis of Pt(Allyl)(iPr$_2$,Et-Amd)

In a Schlenk flask charged with N,N'-diisopropylcarbodiimide (0.51 g, 4.0 mmol) and 10 mL of THF, was added EtLi (0.5 M, 8.0 mL, 4.0 mmol) at room temperature and the resulting mixture was stirred for 3 hours to obtain Li(iPr$_2$, Et-amd) solution. In a separate Schlenk flask charged with [Pt(allyl)Cl]$_4$ (1.1 g, 1.0 mmol) in 10 mL of THF, was added Li(iPr$_2$,Et-amd) solution at room temperature and the resulting mixture was stirred for 1 hour to obtain cloudy orange-brown solution. All the volatiles were removed under reduced pressure to give ocher solid that was extracted with a mixture of 10 mL of pentane and 10 mL of toluene. All the volatiles from the yellow solution were removed under reduced pressure at room temperature to give a crude oil. Pale yellow solid was collected in a Schlenk flask cooled to −196° C. by heating the flask containing crude oil up to 90° C. under dynamic vacuum (~10 Pa). The yield was 0.65 g (1.7 mmol, 42%). mp: 50-60° C. (by DTA).

$^1$H NMR ($C_6D_6$, 400 MHz): 3.7-3.5 (m, 3H, CHH'CHCHH' and $CH_2CHCH_2$), 3.6-3.2 (sept, 2H, $^3J$=6.2 Hz, $J_{Pt-H}$=89.0 Hz, $CHMe_2$), 1.95-1.7 (m, 4H, $J_{Pt-H}$=77.6 Hz, $CH_2CH_3$ and CHH'CHCHH'), 1.11 (d, 6H, J=6.2 Hz, $CHMe_2$), 0.99 (d, 6H, J=6.2 Hz, $CHMe_2$), 0.95 (t, $^3J$=7.7 Hz)

Figure 2:
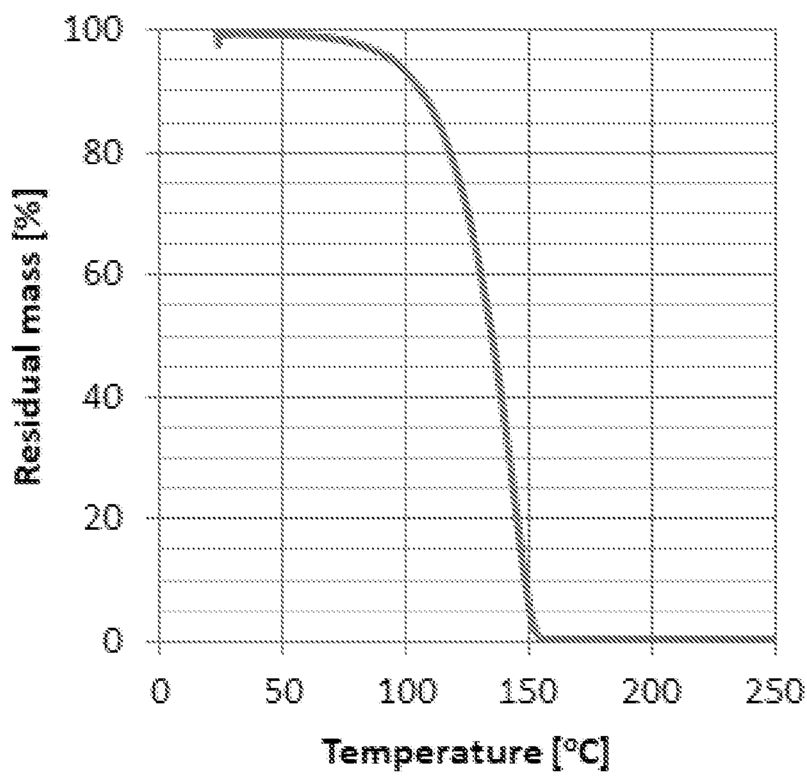
FIG. 2 shows a vacuum TGA for Pt(allyl)($iPr_2$,Et-amd)

TG measurement was carried out under the following measurement conditions: sample weight: 25.10 mg, atmosphere: N2 at 1 atm, and rate of temperature increase: 10.0° C./min. Temperature that 50% of the compound mass had evaporated was 199° C. Vacuum TG measurement was carried out under delivery conditions, under the following measurement conditions: sample weight: 27.64 mg, atmosphere: N2 at 20 mbar, and rate of temperature increase: 10.0° C./min. TG measurement was carried out under delivery conditions into the reactor (about 20 mbar). Temperature that 50% of the compound mass had evaporated was 135° C. Results are charted in FIG. 2.

Prophetic Example of the Use of Pt(Allyl)(iPr$_2$,Et-Amd)

(Deposition Conditions)

Using Pt(allyl)(iPr$_2$,Et-amd) in combination of $H_2$, $O_2$ and/or $O_3$ as the reaction gas, platinum nanodots can be formed on the substrate by the ALD method under the following conditions. Vapors of Pt(allyl)(iPr$_2$,Et-amd), flown at a rate of 2 sccm for 60 s, would be introduced into the a fluidized powder reactor, alternatively with $H_2$ (30 sccm) and $N_2$ gas for 40 s (pulse B). These precursor pulses are separated with a 60 second purge step using 30 sccm of $N_2$ as the purge gas. 12 cycles were performed on a carbon powder having a substrate temperature of 50 to 200° C. in an ALD chamber at a pressure of about 20 torr. As a result, platinum nanodots are expected to be obtained at temperatures ranging from 50 to 300° C.

Synthesis of Pt(Allyl)(iPr$_2$,nBu-Amd)

In a Schlenk flask charged with N,N'-diisopropylcarbodiimide (0.51 g, 4.0 mmol) and 10 mL of THF, was added nBuLi (1.6 M, 2.5 mL, 4.0 mmol) at room temperature and the resulting mixture was stirred for 3 hours to obtain Li(iPr$_2$,nBu-amd) solution. In a separate Schlenk flask charged with [Pt(allyl)Cl]4 (1.1 g, 1.0 mmol) in 10 mL of THF, was added Li(iPr$_2$,nBu-amd) solution at room temperature and the resulting mixture was stirred for 30 minutes to obtain cloudy brown solution. All the volatiles were removed under reduced pressure to give brown oil that was extracted with 10 mL of pentane. All the volatiles from the brown solution were removed under reduced pressure at room temperature to give a crude oil. Pale yellow liquid was collected in a Schlenk flask cooled to −196° C. by heating the flask containing crude oil up to 90° C. under dynamic vacuum (~10 Pa). The yield was 1.38 g (3.3 mmol, 82%). mp: below room temperature.

$^1$H NMR ($C_6D_6$, 400 MHz): 3.7-3.5 (m, 3H, CHH'CHCHH' and $CH_2CHCH_2$), 3.6-3.3 (sept, 2H, $^3J$=6.2 Hz, $J_{Pt-H}$=90.1 Hz, $CHMe_2$), 1.98-1.7 (m, 4H, $CH_2CH_2CH_2CH_3$ and CHH'CHCHH'), 1.5-1.4 (m, 2H, $CH_2CH_2CH_2CH_3$), 1.3-1.2 (m, 2H, $CH_2CH_2CH_2CH_3$), 1.13 (d, 6H, J=6.2 Hz, $CHMe_2$), 1.00 (d, 6H, J=6.2 Hz, $CHMe_2$), 0.80 (t, $^3J$=7.3 Hz, $CH_2CH_2CH_2CH_3$)

Figure 3:
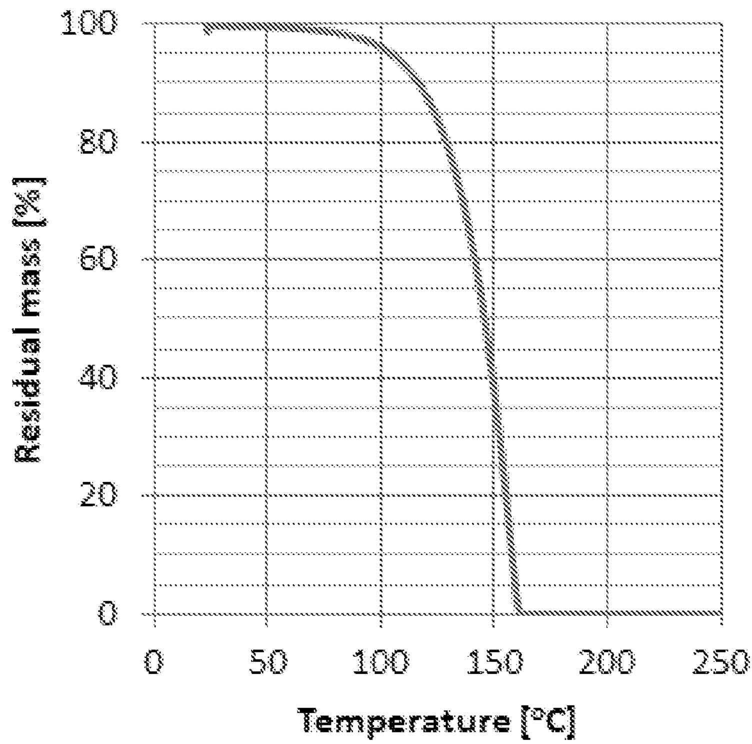
FIG. 3 shows a vacuum TGA for Pt(allyl)($iPr_2$,nBu-amd)

TG measurement was carried out under the following measurement conditions: sample weight: 25.85 mg, atmosphere: N2 at 1 atm, and rate of temperature increase: 10.0° C./min. Temperature that 50% of the compound mass had evaporated was 205° C. Vacuum TG measurement was carried out under delivery conditions, under the following measurement conditions: sample weight: 26.53 mg, atmosphere: N2 at 20 mbar, and rate of temperature increase: 10.0° C./min. TG measurement was carried out under delivery conditions into the reactor (about 20 mbar). Temperature that 50% of the compound mass had evaporated was 146° C. Results are charted in FIG. 3.

Prophetic Example of the Use of Pt(Allyl)(iPr$_2$,nBu-Amd)

(Deposition Conditions)

Using Pt(allyl)(iPr$_2$,nBu-amd) in combination of $H_2$, $O_2$ and/or $O_3$ as the reaction gas, platinum nanodots can be formed on the substrate by the ALD method under the following conditions. Vapors of Pt(allyl)(iPr$_2$,nBu-amd), flown at a rate of 2 sccm for 60 s, would be introduced into the a fluidized powder reactor, alternatively with $H_2$ (30 sccm) and $N_2$ gas for 40 s (pulse B). These precursor pulses are separated with a 60 second purge step using 30 sccm of $N_2$ as the purge gas. 12 cycles were performed on a carbon powder having a substrate temperature of 50 to 200° C. in an ALD chamber at a pressure of about 20 torr. As a result, platinum nanodots are expected to be obtained at temperatures ranging from 50 to 300° C.

Synthesis of Pt(Allyl)(tBu,Et,Me-Amd)

In a Schlenk flask charged with 1-tert-Butyl-3-ethylcarbodiimide (0.51 g, 4.0 mmol) and 10 mL of THF, was added MeLi (1.0 M, 4.0 mL, 4.0 mmol) at room temperature and the resulting mixture was stirred for 3 hours to obtain Li(tBu,Et,Me-amd) solution. In a separate Schlenk flask charged with [Pt(allyl)Cl]$_4$ (1.1 g, 1.0 mmol) in 10 mL of THF, was added Li(iPr-amd) solution at room temperature and the resulting mixture was stirred for 30 minutes to obtain cloudy brown solution. All the volatiles were removed under reduced pressure to give brown oil which was extracted with a mixture of 10 mL of pentane and 10 mL of toluene. All the volatiles from the yellow solution were removed under reduced pressure at room temperature to give a crude solid. Slightly yellow solid was collected in a Schlenk flask cooled to −196° C. by heating the flask containing crude solid up to 80° C. under dynamic vacuum (~10 Pa). The yield was 0.80 g (2.0 mmol, 50%). mp: 70-80° C. (by DTA).

$^1H$ NMR ($C_6D_6$, 400 MHz): 3.8-3.6 (m, 1H, $CH_2CHCH_2$), 3.6-3.5 (m, 2H, CHH'CHCHH'), 3.2-2.9 (m, 2H, $CH_2CH_3$), 2.0-1.7 (m, 2H, $J_{Pt-H}$=79.5 Hz, CHH'CHCHH'), 1.48 (s, 3H, $CH_3$ on amd), 1.25 (s, 9H, $C(CH_3)_3$), 1.08 (t, $^3J$=7.1 Hz, $CH_2CH_3$)

Figure 4:
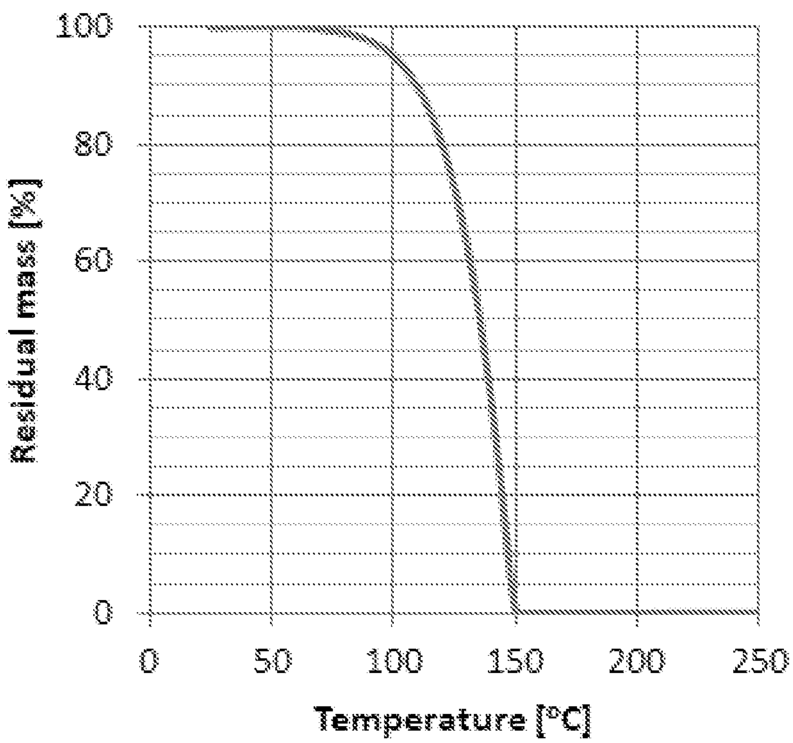
FIG. 4 shows a vacuum TGA for Pt(allyl)(tBu,Et,Me-amd).

TG measurement was carried out under the following measurement conditions: sample weight: 25.76 mg, atmosphere: N2 at 1 atm, and rate of temperature increase: 10.0° C./min. Temperature that 50% of the compound mass had evaporated was 194° C. Vacuum TG measurement was carried out under delivery conditions, under the following measurement conditions: sample weight: 24.93 mg, atmosphere: N2 at 20 mbar, and rate of temperature increase: 10.0° C./min. TG measurement was carried out under delivery conditions into the reactor (about 20 mbar). Temperature that 50% of the compound mass had evaporated was 135° C. Results are charted in FIG. 4.

Prophetic Example of the Use of Pt(Allyl)(tBu,Et,Me-Amd)

(Deposition Conditions)

Using Pt(allyl)(tBu,Et,Me-amd) in combination of $H_2$, $O_2$ and/or $O_3$ as the reaction gas, platinum nanodots can be formed on the substrate by the ALD method under the following conditions. Vapors of Pt(allyl)(tBu,Et,Me-amd), flown at a rate of 2 sccm for 60 s, would be introduced into the a fluidized powder reactor, alternatively with $H_2$ (30 sccm) and $N_2$ gas for 40 s (pulse B). These precursor pulses are separated with a 60 second purge step using 30 sccm of $N_2$ as the purge gas. 12 cycles were performed on a carbon powder having a substrate temperature of 50 to 200° C. in an ALD chamber at a pressure of about 20 torr. As a result, platinum nanodots are expected to be obtained at temperatures ranging from 50 to 300° C.

While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims. The present invention may suitably comprise, consist or consist essentially of the elements disclosed and may be practiced in the absence of an element not disclosed. Furthermore, if there is language referring to order, such as first and second, it should be understood in an exemplary sense and not in a limiting sense. For example, it can be recognized by those skilled in the art that certain steps can be combined into a single step.

The singular forms "a", "an" and "the" include plural referents, unless the context clearly dictates otherwise.

"Comprising" in a claim is an open transitional term which means the subsequently identified claim elements are a nonexclusive listing (i.e., anything else may be additionally included and remain within the scope of "comprising"). "Comprising" as used herein may be replaced by the more limited transitional terms "consisting essentially of" and "consisting of" unless otherwise indicated herein.

"Providing" in a claim is defined to mean furnishing, supplying, making available, or preparing something. The step may be performed by any actor in the absence of express language in the claim to the contrary.

Optional or optionally means that the subsequently described event or circumstances may or may not occur. The description includes instances where the event or circumstance occurs and instances where it does not occur.

Ranges may be expressed herein as from about one particular value, and/or to about another particular value. When such a range is expressed, it is to be understood that another embodiment is from the one particular value and/or to the other particular value, along with all combinations within said range.

All references identified herein are each hereby incorporated by reference into this application in their entireties, as well as for the specific information for which each is cited.

The invention claimed is:

1. A chemical having the formula $M(L5)(L6)x_3$ wherein L5 is an allyl ligand, L6 is an amidinate ligand and $x_3$=1:

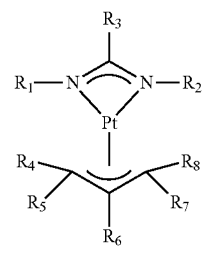

wherein each of $R_1$, $R_2$, $R_3$, $R_4$, $R_5$, $R_6$, $R_7$, and $R_8$ are independently selected from H; a $C_1$-$C_6$ linear, branched, or cyclic alkyl group; a $C_1$-$C_6$, branched, or cyclic alkylsilyl group (mono, bis, or tris alkyl); a $C_1$-$C_6$ linear, branched, or cyclic alkylamino group; or a $C_1$-$C_6$ linear, branched, or cyclic fluoroalkyl group.

2. The chemical of claim 1 having a formula selected from Pt(allyl)(iPr-amd), Pt(allyl)($iPr_2$,Et-amd), Pt(allyl)($iPr_2$,Et-amd), or Pt(allyl)($iPr_2$,nBu-amd), Pt(allyl)(tBu,Et,Me-amd).

3. A composition comprising one or more of the chemicals of claim 1.

4. A method for depositing a Platinum Group Metal containing film, islet or nanodot, the method comprising the steps of:

a) providing a gaseous or vapor phase comprising one or more of the chemicals of claim 1, and b) depositing the film, islet or nanodot onto a substrate.

5. The method of claim 4 comprising depositing the film, islet or nanodot by atomic layer deposition or chemical vapor deposition.

6. The method of claim 4 comprising depositing the film, islet or nanodot by atomic layer deposition.

7. The method of claim 4, wherein a deposition temperature is from about 20° C. to about 300° C.

8. The method of claim 4, wherein the substrate is a cathode or a cathode active material.

9. The method of claim 8, wherein the substrate is a cathode active material.

10. The method of claim 4, wherein the cathode active material, or the cathode active material in the cathode, is selected from the group consisting of a) layered oxides such as Ni-rich cathode materials like NMC (lithium nickel manganese cobalt oxide) and NCA (lithium nickel cobalt aluminum oxide); b) spinel cathode materials such as LMO (lithium manganese oxide), LNMO (lithium nickel manganese oxide); c) Olivine structured cathode materials, in particular the family of Olivine phosphates such as LCP (lithium cobalt phosphate), LNP (lithium nickel phosphate); and combinations thereof.

11. The method of claim 4, further comprising a step of providing an oxidizing co-reactant such as O2, O3, H2O, H2O2, NO, NO2, N2O or a NOx; an oxygen-containing silicon precursor, an oxygen-containing tin precursor, a phosphate such as trimethylphosphate, diethyl phosphoramidate, or a sulfate.

* * * * *